United States Patent
Jacob

(10) Patent No.: US 9,484,428 B2
(45) Date of Patent: Nov. 1, 2016

(54) NON-PLANAR EXCITON TRANSISTOR (BISFET) AND METHODS FOR MAKING

(71) Applicant: GLOBALFOUNDRIES Inc., Grand Cayman (KY)

(72) Inventor: Ajey Poovannummoottil Jacob, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/608,288

(22) Filed: Jan. 29, 2015

(65) Prior Publication Data

US 2016/0225870 A1    Aug. 4, 2016

(51) Int. Cl.
*H01L 29/06* (2006.01)
*H01L 29/49* (2006.01)
*H01L 29/40* (2006.01)

(52) U.S. Cl.
CPC ......... *H01L 29/4991* (2013.01); *H01L 29/401* (2013.01)

(58) Field of Classification Search
CPC .................... H01L 29/401; H01L 29/4991
USPC ............................................. 257/29; 136/205
See application file for complete search history.

(56) References Cited

U.S. PATENT DOCUMENTS

| 9,076,873 B2* | 7/2015 | Chen | H01L 29/4908 |
| 9,362,919 B1* | 6/2016 | Sedighi | H03K 19/195 |
| 2010/0127243 A1* | 5/2010 | Banerjee | B82Y 10/00 257/39 |
| 2012/0138115 A1* | 6/2012 | Chen | H01L 35/32 136/205 |
| 2015/0221499 A1* | 8/2015 | Park | H01L 29/1606 257/29 |

OTHER PUBLICATIONS

Banerjee et al., "Bilayer PseudoSpin Field-Effect Transistor (BiSFET): A Proposed New Logic Device," IEEE Electron Device Letters, 30:158-160, Feb. 2009.
Banerjee et al., "SWAN 2.0 2013 Review," South West Academy of Nanoelectronics.
Mou et al., "Interplay among Bilayer PseudoSpin Field-Effect Transistor (BiSFET) Performance, BiSFET Scaling and Condensate Strength," pp. 309-312, 2014 IEEE.
Mou et al, "BiSFET and ITFETs Device Modeling (with a focus on BiSFET interlayer current I-V," NRI Review 2013.
Reddy et al., "Bilayer pseudoSpin Field Effect Transistor (BiSFET): a proposed logic device and circuits," pp. 67-68, 2009 IEEE.

\* cited by examiner

*Primary Examiner* — David Vu
*Assistant Examiner* — Brandon Fox
(74) *Attorney, Agent, or Firm* — Amerson Law Firm, PLLC

(57) ABSTRACT

A semiconductor device includes a first gate electrode defined on a base layer. A first plurality of layers is disposed on a first sidewall of the first gate electrode. The first plurality of layers includes a first dielectric layer formed on the first sidewall, a first ballistic conductor layer formed above the first dielectric layer, an intermediate layer formed above the first ballistic conductor layer, a second ballistic conductor layer formed above the intermediate layer, and a second dielectric layer formed above the second ballistic conductor layer. A second gate electrode contacts the second dielectric layer.

20 Claims, 4 Drawing Sheets

NON-PLANAR EXCITON TRANSISTOR (BISFET) AND METHODS FOR MAKING

BACKGROUND OF THE INVENTION

1. Field of the Invention

The present disclosure generally relates to the fabrication of semiconductor devices, and, more particularly, to a non-planar exciton transistor (BiSFET) and method for making same.

2. Description of the Related Art

In modern integrated circuits, such as microprocessors, storage devices and the like, a very large number of circuit elements, especially transistors, are provided and operated on a restricted chip area. In integrated circuits fabricated using metal-oxide-semiconductor (MOS) technology, field effect transistors (FETs) (both NMOS and PMOS transistors, or complementary MOSFET transistors or CMOS) are provided that are typically operated in a switching mode. That is, these transistor devices exhibit a highly conductive state (on-state) and a high impedance state (off-state). FETs may take a variety of forms and configurations. For example, among other configurations, FETs may be either so-called planar FET devices (at 20 nm or earlier CMOS nodes) or three-dimensional (3D) devices, such as finFET devices (at 20 nm or later 14 nm CMOS nodes).

A field effect transistor (FET), irrespective of whether an NMOS transistor or a PMOS transistor is considered, and irrespective of whether it is a planar or 3D finFET device, typically includes doped source/drain regions that are formed in a semiconductor substrate that are separated by a channel region. A gate insulation layer (e.g., dielectric) is positioned above the channel region and a conductive gate electrode is positioned above the gate insulation layer. The gate insulation layer and the gate electrode may sometimes be referred to as the gate structure or gate stack for the device. By applying an appropriate voltage to the gate electrode, the channel region becomes conductive and current is allowed to flow from the source region to the drain region. In a planar FET device, the gate structure is formed above a substantially planar upper surface of the substrate. The gate structures for such planar FET devices may be manufactured using so-called "gate-first" or "replacement gate" (gate-last) manufacturing techniques.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region (leading to large leakage current between source and drain in "off state") and the channel from being adversely affected by the electrical potential of the drain. This is sometimes referred to as a so-called short channel effect, wherein the characteristic of the FET as an active switch is degraded. The short channel effect also increases power dissipation.

To address limitations associated with conventional FETs, various new types of transistor configurations are being explored. One such new transistor configuration is a bilayer pseudo-spin field effect transistor (BiSFET), also referred to as an exciton transistor. An exciton transistor includes first and second planar conducting layers separated by a tunnel dielectric. First and second gate electrodes are capacitively coupled to the conducting layers through gate dielectric layers. The gate electrodes and gate dielectrics are also planar structures. One performance-affecting parameter of an exciton transistor is the dielectric constant of the tunnel dielectric. Also, the planar nature of the exciton transistors is a limiting factor in their scalability.

The present disclosure is directed to various methods and resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming non-planar exciton transistor devices (BiSFETs). A method includes forming a conductive fin above a base layer. A plurality of layers is formed above the conductive fin. The plurality of layers includes a first dielectric layer, a first ballistic conductor layer formed above the first dielectric layer, an intermediate layer formed above the first ballistic conductor layer, a second ballistic conductor layer formed above the intermediate layer, and a second dielectric layer formed above the second ballistic conductor layer. A conductive layer is formed above the plurality of layers. The conductive layer and the plurality of layers are planarized to expose a top surface of the conductive fin, to define a first sidewall stack from the plurality of layers on a first sidewall of the conductive fin, and to define a first gate electrode from the conductive layer adjacent the first sidewall stack. The first gate electrode contacts the second dielectric layer in the first sidewall stack, and the conductive fin comprises a second gate electrode contacting the first dielectric layer in the first sidewall stack.

One illustrative semiconductor device disclosed herein includes, among other things, a first gate electrode defined on a base layer. A first plurality of layers is disposed on a first sidewall of the first gate electrode. The first plurality of layers includes a first dielectric layer formed on the first sidewall, a first ballistic conductor layer formed above the first dielectric layer, an intermediate layer formed above the first ballistic conductor layer, a second ballistic conductor layer formed above the intermediate layer, and a second dielectric layer formed above the second ballistic conductor layer. A second gate electrode contacts the second dielectric layer.

BRIEF DESCRIPTION OF THE DRAWINGS

The disclosure may be understood by reference to the following description taken in conjunction with the accompanying drawings, in which like reference numerals identify like elements, and in which.

Figure 1A:
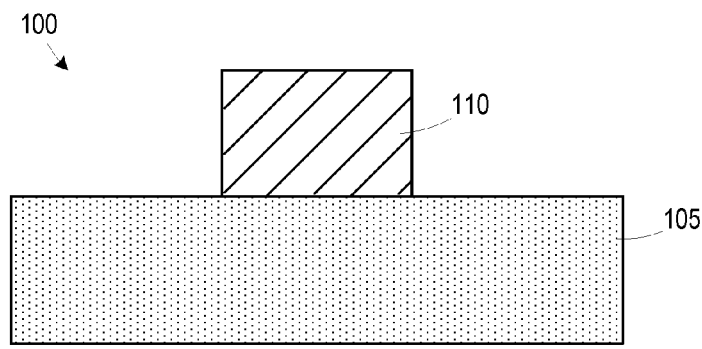
FIGS. 1A-1E depict various methods disclosed herein of forming a non-planar exciton transistor device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming non-planar exciton (BiSFET) transistor devices. As will be readily apparent to those skilled in the art upon a complete reading of the present application, the present methods and devices are applicable to a variety of devices, including, but not limited to, logic devices, memory devices, etc. With reference to the attached figures, various illustrative embodiments of the methods and devices disclosed herein will now be described in more detail.

FIGS. 1A-1E depict various methods disclosed herein of forming a non-planar exciton transistor device 100. FIG. 1A illustrates a base layer 105 with a conductive structure 110, such as a conductive fin, defined thereon. In one embodiment, the conductive structure 110 may comprise copper. In the illustrated example, the base layer 105 is a substrate. In some embodiments, the base layer 105 may be a substrate or a process layer formed on a substrate. The base layer 105 may have a variety of configurations, such as the depicted bulk silicon configuration. The base layer 105 may also have a silicon-on-insulator (SOI) configuration that includes a bulk silicon layer, a buried insulation layer and an active layer, wherein semiconductor devices are formed in and above the active layer. The base layer 105 may be formed of silicon or silicon germanium or it may be made of materials other than silicon, such as germanium. Thus, the terms "substrate" or "semiconductor substrate" should be understood to cover all semiconducting materials and all forms of such materials. The base layer 105 may have different layers. For example, the base layer 105 may include a layer of insulating material (e.g., silicon dioxide) formed above a silicon-containing substrate.

Figure 1B:
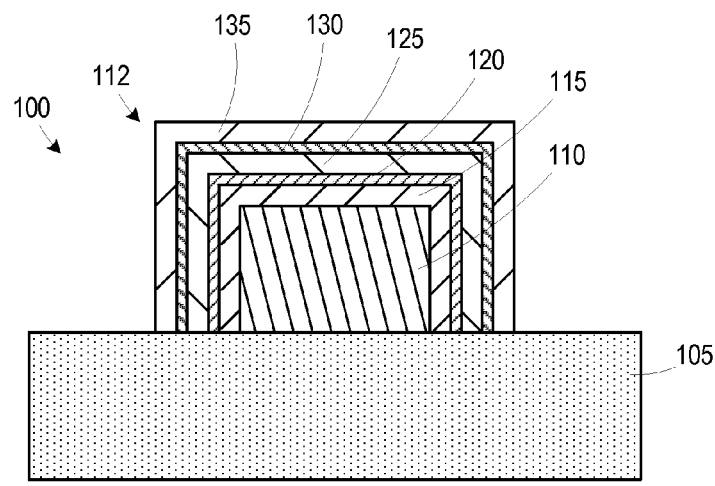

FIG. 1B illustrates the device 100 after a plurality of selective deposition processes were performed to deposit a plurality of layers 112 on the conductive structure 110. The conductive structure 110 acts as a growth template for the plurality of layers 112. The plurality of layers 112 includes a first dielectric layer 115, a first ballistic conductor layer 120, an intermediate layer 125, a second ballistic conductor layer 130, and a second dielectric layer 135. The first and second dielectric layers 115, 135 may be formed of boron nitride (BN), a different low-k dielectric material having a dielectric constant of approximately 3.0 or lower, or an ultra-low-k (ULK) material having a dielectric constant of approximately 2.5 or lower. In some embodiments, the intermediate layer 125 may be the same material as the first and second dielectric layers 115, 135. In other embodiments, the intermediate layer 125 may be a layer that can be selectively etched relative to the other layers in the plurality of layers 112. The thicknesses of the layers 115, 120, 125, 130 and 135 may vary depending upon the particular application and they are exaggerated for ease of illustration.

The first and second ballistic conductor layers 120, 130 are formed from a material that exhibits ballistic conduction, also referred to as ballistic transport, where the transport of electrons occurs in a medium having negligible electrical resistivity caused by electron scattering. These materials are also referred to as materials that are capable of generating boson condensate. In contrast, a conventional Ohmic conductor material has a resistivity value that is in large part defined by the degree of electron scattering within the material.

Exemplary ballistic conductor materials include, but are not limited to, graphene, carbon nanotubes, silicon nanowires, samarium hexaboride, stanene, silicene, boronene and topolocial insulators, such as mercury telluride, cadmium telluride, bismuth antimonide, pure antimony, bismuth selenide, bismuth telluride and antimony telluride. In general, ballistic conductor materials may be formed in very thin sheets, sometime as thin as the thickness of a single atom. The manner in which such ballistic conductor materials may be formed is known to those skilled in the art.

Figure 1C:
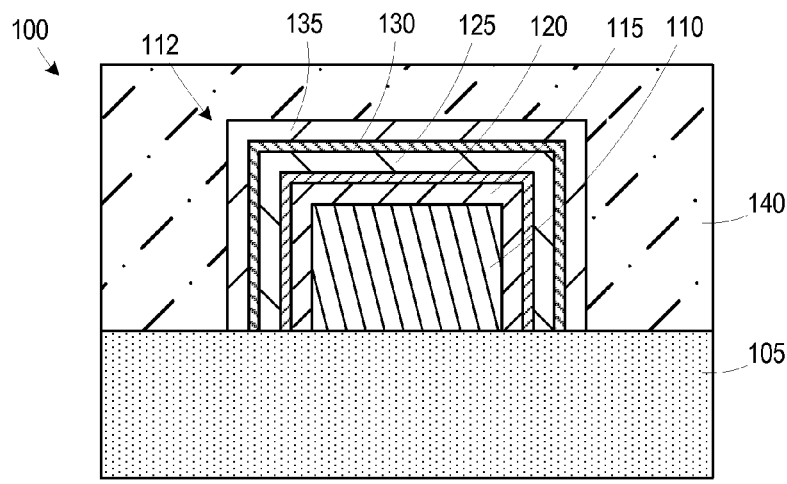

FIG. 1C illustrates the device 100 after a deposition process was performed to deposit a conductive layer 140 (e.g., copper, nickel, or other material(s) that provide Ohmic contact with the ballistic conductor material 135) above the plurality of layers 112. In the depicted example, the conductive layer 140 is formed around the layers 112. In other embodiments, a dielectric layer (not shown) may be formed above the plurality of layers 112 and patterned to define a recess (not shown) exposing a portion of the layer 135 of the device 100. The recess may be filled with the material of the conductive layer 140 and a planarization process may be performed to remove any material extending above the recess.

Figure 1D:
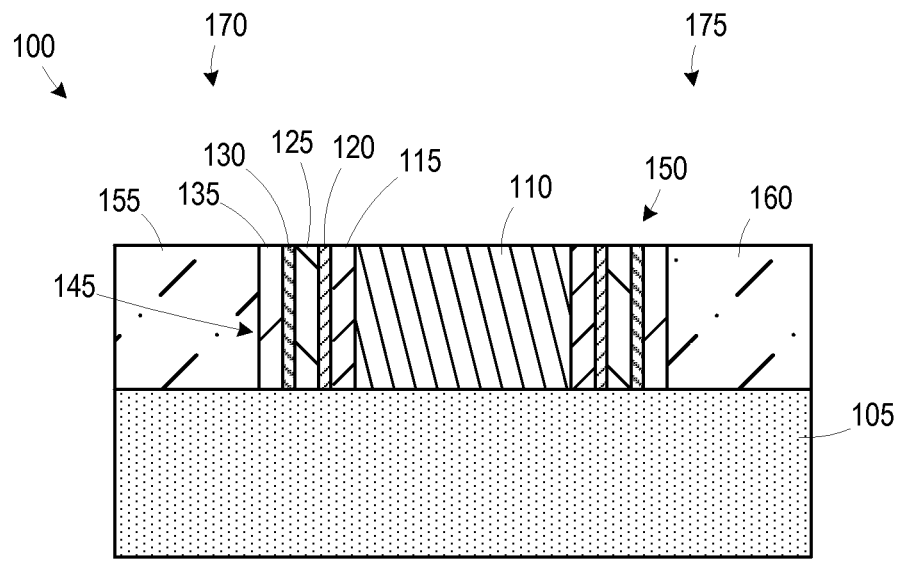

FIG. 1D illustrates the device 100 after a planarization process was performed (or the conductive material planarization was continued) to remove portions of the plurality of layers 112 to expose a top surface of the conductive structure 110, thereby defining first and second sidewall stacks 145, 150 from the plurality of layers 112 and gate electrodes 155, 160 from the conductive layer 140.

Figure 1E:
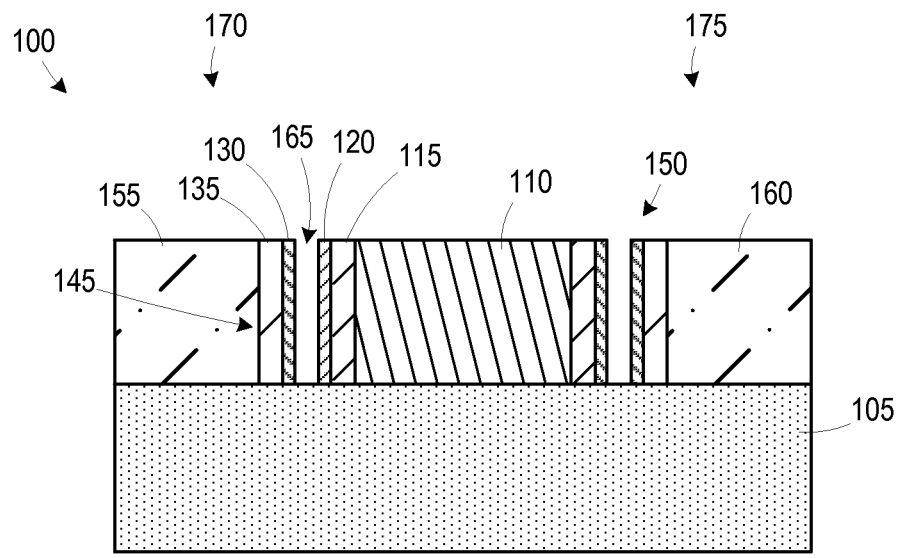

FIG. 1E illustrates the device 100 after an etch process was performed to remove the intermediate layer 125 to define an air gap 165 between the ballistic conductor layers 120, 130 in each of the stacks 145, 150. The etch process may be selective to the material of the intermediate layer 125 or a masking process may be used to selectively expose and remove the intermediate layer 125. The structure in FIG. 1E illustrates two adjacent exciton transistors 170, 175 with a shared gate electrode defined by the conductive structure 110. The ballistic conductor layers 120, 130 are the conductive layers of the exciton transistor, the first and second dielectric layers 115, 135 are the gate dielectric layers of the exciton transistor, and the air gap 165 is the tunnel dielectric layer of the exciton transistor.

In one embodiment, the structure of FIG. 1D also illustrates two adjacent exciton transistors 170, 175, where the intermediate layer 125 is a dielectric layer and serves as the tunnel dielectric layer, i.e., the air gap 165 is not formed in this embodiment.

In the exciton transistors 170, 175 of FIG. 1D or 1E, voltages applied at the gate electrodes 155, 160, 110 electrostatically dope the ballistic conductor layers 120, 130. A negative gate voltage is applied to one gate electrode of each transistor 170, 175, such as the gate electrodes 155, 160, and a positive gate voltage is applied to the other gate electrode 110. In some embodiments, the ballistic conductor layers 120, 130 may be doped with N- or P-type dopants in combination with the use of electrostatic doping. Electrons in the conduction band in one of the ballistic conductor layers 120, 130 can pair with holes in the valence band in the other ballistic conductor layer 120, 130 resulting in electron-hole-pairs, also referred to as excitons or Bosons, which then can condense, referred to as Bose-Einstein condensate. The condensation alters the quantum wavefunctions in the bilayer qualitatively, converting states that were isolated in one of the two ballistic conductor layers 120, 130 into states that are a coherent linear combination of top and bottom layer components. This qualitative change effectively shorts the two ballistic conductor layers 120, 130, reducing the tunnel resistance from its previously large value. The Bose-Einstein condensate can be collected at the drain as an electrical current.

Figure 2A:
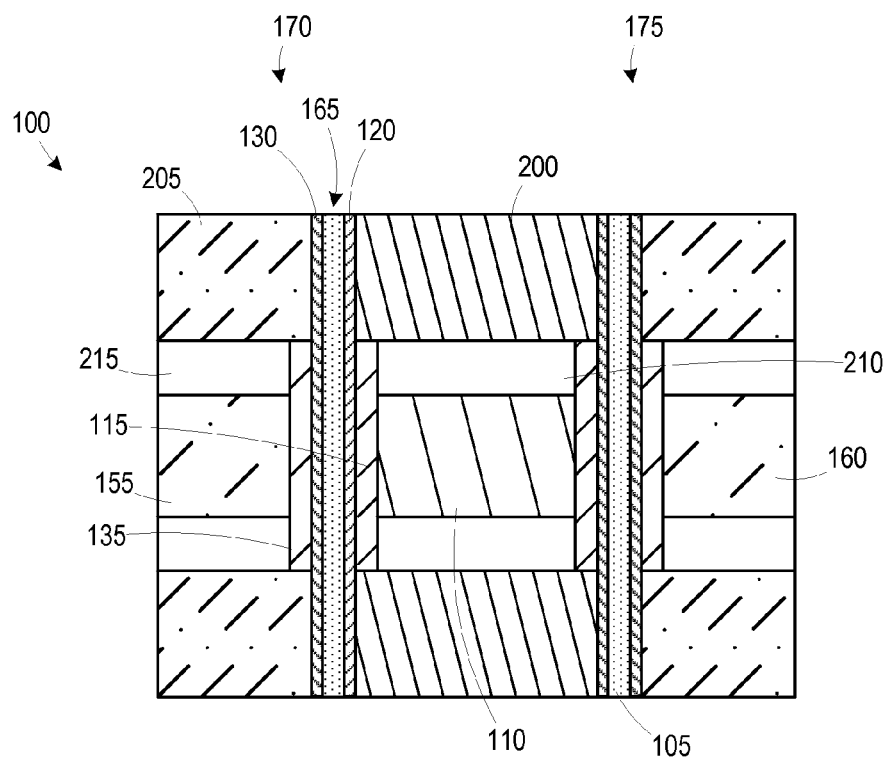
FIGS. 2A-2C depict top views of exemplary exciton transistor devices illustrating alternative contact configurations.

FIG. 2A illustrates a top view of the device 100 of FIG. 1E. A first contact 200 (e.g., the same material as the conductive structure 110) interfaces with the first conductive layer 120, and a second contact 205 (e.g., the same material as the gate electrode 155) interfaces with the second conductive layer 130. An isolation structure 210 isolates the conductive structure 110 from the first contact 200 and an isolation structure 215 isolates the gate electrode 155 from the second contact 205. To form the contacts 200, 205, the first and second dielectric layers 115, 135 may be selectively removed while masking the conductive structure 110 and the resulting gaps may be filled with a conductive material. The isolation structures 210, 215 may be formed by selective deposition after forming the conductive layer 140 (e.g., selective photolithography and deposition of dielectric material. Vias (not shown) may be formed in a metallization layer formed above the device 100 to interface with the gate electrodes 155, 160, the conductive structure 110, and the contacts 200, 205.

Figure 2B:
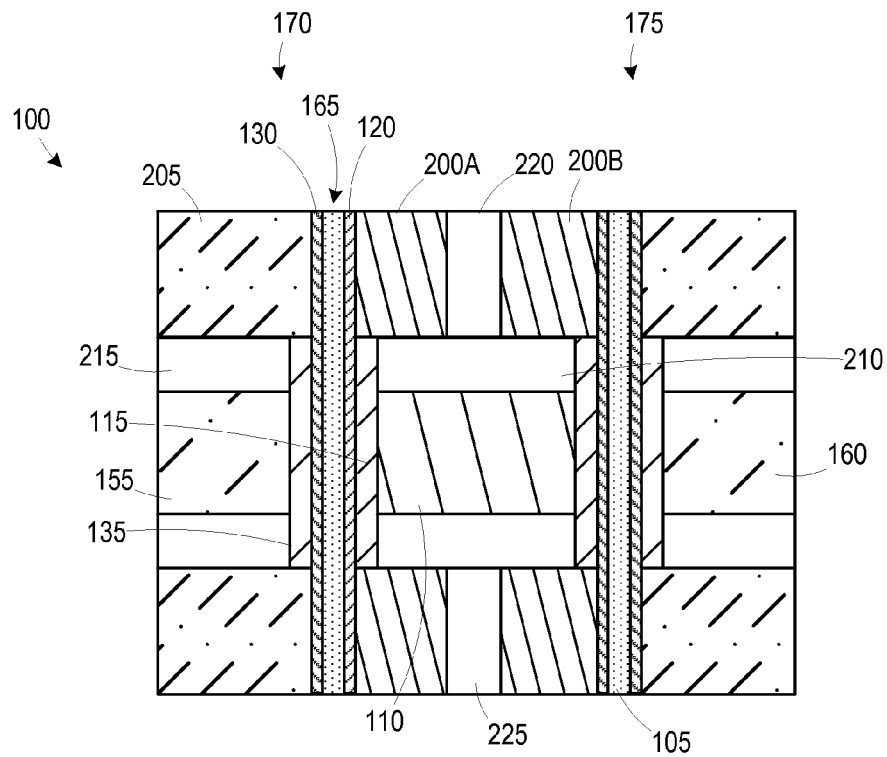

FIG. 2B illustrates a top view of an alternative embodiment of the device 100 wherein additional isolation structures 220, 225 are provided to divide the contact 200 into separate contacts 200A, 200B to provide separation for the devices 170, 175.

Figure 2C:
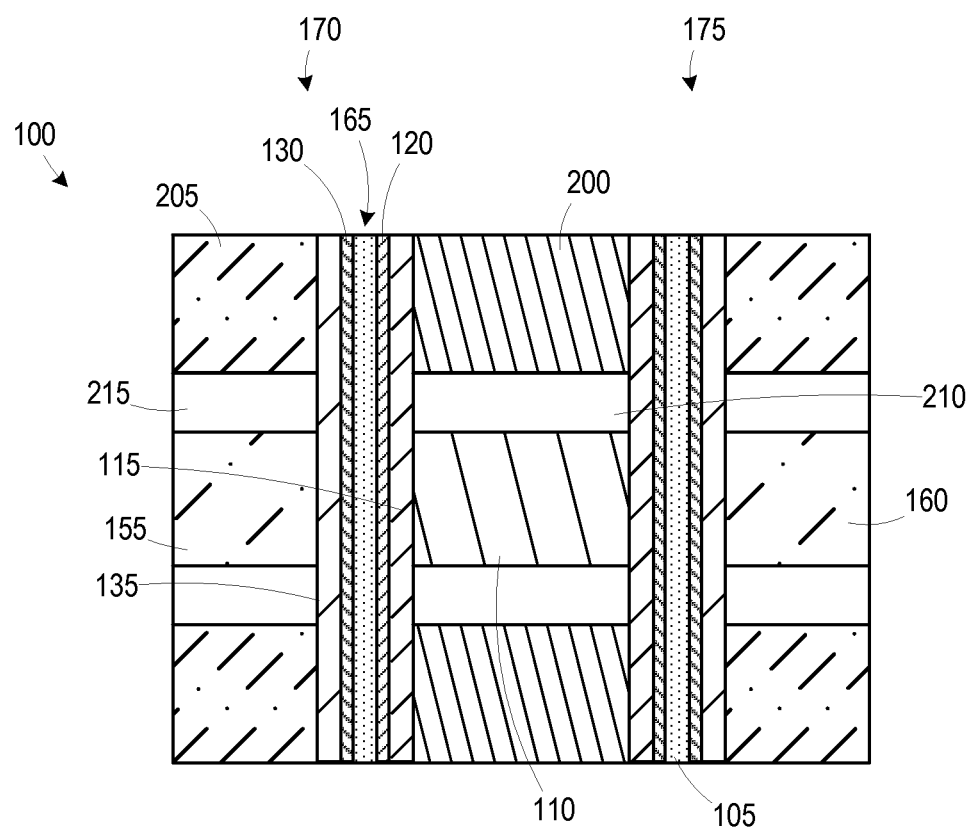

FIG. 2C illustrates a top view of yet another alternative embodiment of the device 100 of FIG. 1E. The first and second dielectric layers 115, 135 are not selectively removed. Tunneling currents are used to establish contact between the first contact 200 and the first conductive layer 120 and between the second contact 205 and the second conductive layer 130.

The vertical exciton transistor 100 described herein has the advantage of an optional air gap for the tunneling dielectric and may be readily scaled due to its non-planar nature. These advantages correlate to increased performance and flexibility.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    forming a conductive structure above a base layer;
    forming a plurality of layers above said conductive structure, said plurality of layers comprising a first dielectric layer, a first ballistic conductor layer formed above said first dielectric layer, an intermediate layer formed above said first ballistic conductor layer, a second ballistic conductor layer formed above said intermediate layer, and a second dielectric layer formed above said second ballistic conductor layer;
    forming a conductive layer above said plurality of layers; and
    planarizing said conductive layer and said plurality of layers to expose a top surface of said conductive structure, to define a first sidewall stack from said plurality of layers on a first sidewall of said conductive structure, and to define a first gate electrode from said conductive layer adjacent said first sidewall stack, wherein said first gate electrode contacts said second dielectric layer in said first sidewall stack, and said conductive structure comprises a second gate electrode contacting said first dielectric layer in said first sidewall stack.

2. The method of claim 1, further comprising:
    forming a first contact coupled to said first ballistic conductive layer in said first sidewall stack; and
    forming a second contact coupled to said second ballistic conductor layer in said first sidewall stack.

3. The method of claim 2, wherein planarizing said conductive layer and said plurality of layers comprises defining a second sidewall stack from said plurality of layers on a second sidewall of said conductive structure and defining a third gate electrode from said conductive layer adjacent said second sidewall stack, and the method further comprises:
 forming a third contact coupled to said first ballistic conductive layer in said second sidewall stack; and
 forming a fourth contact coupled to said second ballistic conductor layer in said second sidewall stack.

4. The method of claim 3, further comprising forming an isolation structure between said third and fourth contacts.

5. The method of claim 2, wherein planarizing said conductive layer and said plurality of layers comprises defining a second sidewall stack from said plurality of layers on a second sidewall of said conductive structure and defining a third gate electrode from said conductive layer adjacent said second sidewall stack, and the method further comprises:
 forming a third contact coupled to said second ballistic conductive layer in said second sidewall stack, wherein said first contact is coupled to said first ballistic conductor layer in said first sidewall stack and said first ballistic conductor layer in said second sidewall stack.

6. The method of claim 1, further comprising removing said intermediate layer to define an air gap between said first and second ballistic conductor layers, said air gap comprising a tunnel dielectric layer.

7. The method of claim 1, wherein said intermediate layer comprises a dielectric layer.

8. The method of claim 1, wherein said first and second ballistic conductor layers comprise graphene.

9. The method of claim 8, wherein said first and second dielectric layers comprise boron nitride.

10. The method of claim 1, wherein said base layer comprises silicon.

11. The method of claim 1, wherein said base layer comprises a dielectric layer.

12. A semiconductor device, comprising:
 a first gate electrode having first and second vertical sidewalls and a bottom surface contacting a base layer;
 a first plurality of layers disposed on said first vertical sidewall of said first gate electrode, said first plurality of layers comprising a first dielectric layer formed on said first vertical sidewall, a first ballistic conductor layer formed on said first dielectric layer, an intermediate layer formed on said first ballistic conductor layer, a second ballistic conductor layer formed on said intermediate layer, and a second dielectric layer formed above said second ballistic conductor layer; and
 a second gate electrode contacting said second dielectric layer.

13. The device of claim 12, further comprising:
 a first contact coupled to said first ballistic conductive layer; and
 a second contact coupled to said second ballistic conductor layer.

14. The device of claim 13, further comprising:
 a second plurality of layers disposed on said second vertical sidewall of said first gate electrode, said second plurality of layers comprising a first dielectric layer formed on said second vertical sidewall, a first ballistic conductor layer formed on said first dielectric layer, an intermediate layer formed on said first ballistic conductor layer, a second ballistic conductor layer formed on said intermediate layer, and a second dielectric layer formed on said second ballistic conductor layer;
 a third gate electrode contacting said second dielectric layer in said second plurality of layers;
 a third contact coupled to said first ballistic conductive layer in said second plurality of layers; and
 a fourth contact coupled to said second ballistic conductor layer in said second plurality of layers.

15. The device of claim 14, further comprising an isolation structure disposed between said third and fourth contacts.

16. The device of claim 13, further comprising:
 a second plurality of layers disposed on said second vertical sidewall of said first gate electrode, said second plurality of layers comprising a first dielectric layer formed on said second vertical sidewall, a first ballistic conductor layer formed on said first dielectric layer, an intermediate layer formed on said first ballistic conductor layer, a second ballistic conductor layer formed on said intermediate layer, and a second dielectric layer formed on said second ballistic conductor layer;
 a third gate electrode contacting said second dielectric layer in said second plurality of layers; and
 a third contact coupled to said first ballistic conductive layer in said second plurality of layers, wherein said first contact is coupled to said first ballistic conductor layer in said first sidewall stack and said first ballistic conductor layer in said second sidewall stack.

17. The device of claim 12, wherein said intermediate layer comprises an air gap defined between said first and second ballistic conductor layers.

18. The device of claim 13, wherein said intermediate layer comprises a dielectric layer.

19. The device of claim 12, wherein said first and second ballistic conductor layers comprise graphene.

20. The device of claim 19, wherein said first and second dielectric layers comprise boron nitride.

* * * * *